United States Patent [19]

Jones et al.

[11] 3,745,373

[45] July 10, 1973

[54] PRECISION RAMP GENERATOR WITH PRECISE STEADY STATE OUTPUT

[75] Inventors: Hale M. Jones, Playa Del Rey; Richmon E. Deas, Manhattan Beach, both of Calif.

[73] Assignee: Ampex Corporation, Redwood City, Calif.

[22] Filed: Mar. 3, 1972

[21] Appl. No.: 231,615

[52] U.S. Cl. .................. 307/228, 307/229, 307/261, 307/321, 328/127, 328/181, 328/208

[51] Int. Cl. ............................................ H03k 4/08

[58] Field of Search.................... 307/228, 229, 261, 307/321; 328/181–185, 127

[56] References Cited

UNITED STATES PATENTS

| | | | |
|---|---|---|---|
| 3,350,651 | 10/1967 | Davis | 328/181 |
| 3,402,353 | 9/1968 | Hubbs | 307/261 X |
| 3,405,286 | 10/1968 | Mudie | 307/261 |
| 3,610,952 | 10/1971 | Chandos | 307/228 |
| 3,621,470 | 11/1971 | Davis | 307/228 X |
| 3,676,698 | 7/1972 | Hunter | 307/228 |
| 3,628,064 | 12/1971 | Camenzind | 307/261 |

*Primary Examiner*—Stanley D. Miller, Jr.
*Attorney*—Robert G. Clay

[57] ABSTRACT

A capstan motor drive circuit for a tape transport includes a precision, dual polarity ramp generator circuit having an input diode bridge circuit with a cross-coupling Zener diode arranged to provide precisely controlled currents of opposite polarities at a summing junction in response to positive and negative input levels respectively. A constant current source activated by the current at the summing junction is connected to drive a single operational amplifier having capacitive feedback and acting as an integrating amplifier to generate both positive and negative ramp signals. A single variable resistance in a feedback coupling between the output of the operational amplifier and the summing junction controls the amplitude of the ramp for both polarities. The output returns to a precise zero point in the absence of an input and any small variations in the output affect both positive and negative ramps equally. Direct coupling between the integrating amplifier and a capstan servo loop permits greatly improved system response by providing a constant input impedance.

9 Claims, 3 Drawing Figures

PRECISION RAMP GENERATOR WITH PRECISE STEADY STATE OUTPUT

BACKGROUND OF THE INVENTION

1. Field of the Invention

This invention relates to ramp signal generators and more particularly to ramp signal generators providing ramp signals of either polarity and adjustable amplitudes.

2. History of the Prior Art

Ramp signal generators have a wide variety of uses throughout the electronics industry and many schemes have been developed for their implementation. Such schemes generally involve the use of a constant current source driving an integrator such as an operational amplifier having capacitive feedback. Complicated arrangements are frequently included for temperature compensation, zero output control and adjustments for slope and maximum voltage of both positive and negative ramps.

In some digital systems, such as control systems for digital magnetic tape transports, command signals for forward and reverse directional control are provided as a single input signal, the polarity of which indicates the desired direction. To start, stop or reverse direction, the input signal is changed with an abrupt transition. The tape transport, however, typically has a servo-controlled capstan drive that generally uses a ramp reference signal to control acceleration and deceleration. The ramp signal generator responds to the command signal by providing a positive or negative ramp signal to control acceleration in a positive or negative direction and then an opposite polarity ramp signal to control deceleration upon termination of the command signal. At constant speed in either direction a steady state signal of selected amplitude is utilized as the servo reference. Provision of all these functions has heretofore required relatively complex circuitry as well as a variety of adjustments.

Conventional capstan drive systems utilize ramp generators having separate outputs from positive and negative ramps. These outputs must be coupled to the capstan servo loop through isolation diodes to allow separate adjustment of opposite polarities of the ramp signal. However, these isolation diodes have an adverse effect on the capstan servo loop which has a certain amount of damping provided by the feedback circuit. For purposes of rapid, high speed capstan motor response, it is desirable to have minimum damping in the compensation circuit. The requirement for damping varies, however, with the input impedance to the servo loop. If the input impedance is low, very little compensation is required; but if the input impedance is high, substantial compensation is required to prevent oscillation of the capstan servo loop. The isolating diodes of conventional systems present low input impedance requiring little compensation when conducting but very high impedance requiring substantial compensation when neither is conducting. Because of the expense of an adaptive arrangement accommodating both conditions, an undesirable compromise is generally reached as to the amount of compensation provided.

SUMMARY OF THE INVENTION

A precision, dual polarity ramp generator in accordance with the invention has a relatively simple construction susceptible to monolithic integrated circuit manufacture and requires only one adjustment for control of the voltage level of both polarities of output ramps. When directly coupled to a servo loop, such as the servo loop of a capstan drive circuit for a tape transport, the ramp generator provides a constant impedance input for optimum frequency response in the servo loop.

The ramp generator provides precise temperature compensated dual polarity reference currents in response to particularly characterized positive and negative step inputs. A feedback circuit including a single variable resistance for both positive and negative ramps provides a feedback current proportional to the circuit output. The ramp signal is generated by an integrating amplifier which is driven by a dual polarity constant current source in response to a difference between the reference and feedback currents.

In one example of a specific circuit in accordance with the invention, an input diode bridge circuit controls the voltage across a Zener diode coupled between opposite midpoints of the bridge circuit and two output terminals of the circuit are coupled through matched resistors to a summing junction. Alternate terminals of the Zener diode are clamped in response to positive and negative input voltages respectively, with the circuit providing precisely controlled reference currents of opposite polarities through the two resistors to the summing junction. The Zener diode may be selected to have a temperature sensitivity that compensates for that of other circuit elements.

A constant current source, which may include a high gain amplifier activating a bridge limiter used as a voltage controlled current source, drives an integrating amplifier in response to currents at the summing junction. Because of the high gain of the activating amplifier, the bridge limiter effectively operates in a switching mode to provide a rapid, precise output response. A ramp control potentiometer is in a feedback circuit from the output of the integrating amplifier to the summing junction. When the output ramp signal reaches a voltage magnitude sufficient for the current through the feedback resistance to equal the reference current, there is no current for driving the activating amplifier and the ramp levels off. When the input signal returns to zero, the output signal also is ramped back to a very precise zero point.

In additional embodiments a variety of features may be added to obtain modified or asymmetrical characteristics in the output signal. For instance, replacement of the matched resistances in the input bridge circuit with variable resistances permits independent control of the ultimate magnitudes of positive and negative ramps. Connection of a negative input of the activating amplifier to a DC voltage source shifts the output signal by an amount equal to the magnitude of the source. In addition, the use of variable resistances between the positive and negative supply voltages and the bridge limiter circuit permits independent control of the ramp slopes while the use of a variable impedance between the bridge limiter and the integrating amplifier permits common control of positive and negative ramp slopes.

When used in its basic form, the single adjustment of the ramp generator circuit minimizes calibration time and increases reliability by minimizing the number of electromechanical components. In addition, all components are suitable for medium scale integration and packaging in dual inline packages.

BRIEF DESCRIPTION OF THE DRAWINGS

A better understanding of the invention may be had from a consideration of the following detailed description taken in conjunction with the accompanying drawings, in which.

DETAILED DESCRIPTION

Figure 1:
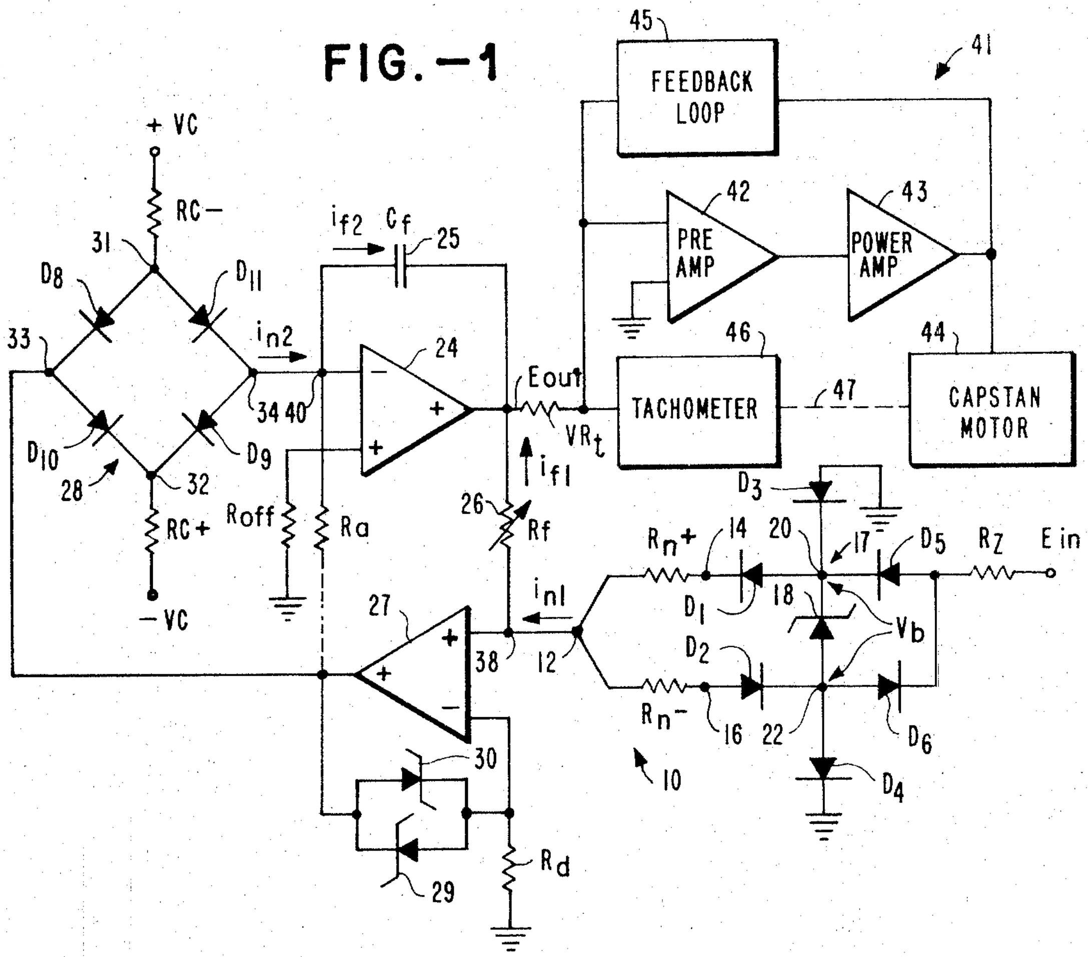
FIG. 1 is a schematic diagram of a capstan drive circuit employing a ramp generator in accordance with the invention.

As shown in FIG. 1, a ramp generator 10 in accordance with the invention generates dual polarity voltage ramps in response to positive and negative input signals Ein. The ramp generator 10 provides a precise reference current at a junction 12, to control the ultimate magnitudes of the positive and negative ramps. The junction 12 is located between two resistors R*n*+ and R*n*− which are connected between two terminals 14, 16 of an input bridge circuit 17 which develops a selected reverse breakdown voltage across a Zener diode 18.

The Zener diode 18 is connected to provide its reverse breakdown voltage between a cathode terminal 20 and an anode terminal 22. The input bridge circuit 17 which develops the reverse breakdown voltage in response to an input voltage includes diode D1 conducting current from the cathode 20 to the terminal 14, diode D2 conducting current from the terminal 16 to the anode 22, diode D3 connected to conduct current from ground to cathode 20, diode D4 connected to conduct current from anode 22 to ground, diode D5 connected to conduct current from input Ein to cathode 20 and diode D6 connected to conduct current from anode 22 to input Ein. It is not only possible to implement the input bridge circuit by constructing it as a monolithic device, but desirable, as a monolithic construction assures greater uniformity of operating characteristics of diodes D1–D6.

In operation, a positive input voltage at Ein causes current to flow through resistor $R_z$, diode D5, Zener diode 18 and diode D4, establishing the reverse breakdown voltage V*b* across Zener diode 18 with the anode 22 clamped with respect to ground. A negative input voltage at Ein causes current to flow from ground through diode D3, Zener diode 18 and diode D6 and resistor $R_z$ to Ein. A negative input voltage at Ein causes the cathode 20 to be clamped with respect to ground. Under steady state conditions, the voltage level at the junction 12 is maintained at virtual ground and a precisely controlled reference current $I_{n1} = Vb/Rn+$ or $I_{n1} = Vb/Rn-$ is provided at the junction 12. As long as the resistors R*n*+ and R*n*− are precision resistors which are equal in value and as long as the voltages at Ein exceed V*b*, the magnitude of $I_{n1}$ will be equal for both positive and negative input voltages Ein and will be nearly independent of the magnitude of Ein. Because the single Zener diode 18 determines the magnitude of both positive and negative voltages across resistors R*n*+ and R*n*−, there are no problems with matching Zener diodes or with deviations due to aging. Furthermore, the reverse breakdown voltage V*b* is preferably chosen to be in the approximate range of 5.1 to 5.6 volts and has almost no temperature sensitivity as Zener diodes operated in this range of voltages are extremely stable.

The output signal Eout is provided by an integrating operational amplifier 24 having an integrating feedback capacitor $C_f$ 25 connected between the output and an inverting input. A variable resistance 26, designated as a feedback resistor $R_f$, which may be a potentiometer, is connected between the output and the junction 12 to provide feedback.

A constant current circuit is connected to provide current to the inverting input 40 of operational amplifier 24 in response to positive and negative net currents at the summing junction 12. In the preferred arrangement, the constant current source includes an operational amplifier 27 and a bridge limiter circuit 28 having diodes D8–D11 connected between a first current source −V*c*/R*c*+ and a second current source +V*c*/R*c*−. Like the input bridge circuit 17, the bridge limiter circuit 28 is preferably constructed as a monolithic integrated circuit. The operational amplifier 27 is connected by its positive input to the junction 12 and has its inverting input connected through a damping resistor $R_d$ to ground. In addition, a pair of opposite polarity diodes 29 and 30 may be connected in parallel between the output and negative input of the operational amplifier 27 to act as Zener diodes to limit the maximum output voltage of the amplifier 27. An operational amplifier does not swing from a positive voltage to a negative voltage instantaneously but instead does so at a predetermined rate inherent in the type of amplifier which is selected. If the maximum output voltage is limited, as by diodes 29 and 30, the maximum swing time is also limited and the system response rate is improved. Since the output of amplifier 27 need not exceed the forward bias voltage of bridge diodes to switch off the bridge limiter circuit 28, costs can be reduced by implementing diodes 29 and 30 with standard diodes provided on the same integrated circuit chip as the diodes in the bridge limiter circuit 28. When so used, the output voltage of the amplifier 27 is limited by the forward bias voltage of the diodes 29 and 30.

The bridge limiter 28 has a first terminal 31 connected through a resistance R*c*− to a positive voltage +V*c*, a second terminal 32 connected through a resistance R*c*+ to a negative voltage −V*c*, a third terminal 33 connected to the output of amplifier 27 and a fourth terminal 34 connected to the inverting input of amplifier 24. A diode D8 conducts current from the first terminal 31 to the third terminal 33, a diode D9 conducts current from the fourth terminal 34 to the second terminal 32, a diode D10 conducts current from the third terminal 33 to the second terminal 32 and a diode D11 conducts current from the first terminal 31 to the fourth terminal 34.

In an alternative arrangement, the bridge limiter circuit 28 may be eliminated and a resistance Ra connected between the output of amplifier 27 and the inverting input of amplifier 24 as shown in dashed lines in FIG. 1. In this arrangement, the maximum output voltage of amplifier 27 connected to resistor R*a* creates a constant current source to drive the amplifier 24. Although this arrangement is somewhat simpler, it lacks precise control of the output slope offered by the preferred arrangement.

To facilitate a description of the operation of the ramp generator 10, several currents will be identified. A current $I_{f1}$ passes through the variable feedback resistor 26 from the junction 12 to the output and a current $I_{n1}$ flows from the junction 12 to a junction 38 of resistor $R_f$ with the positive input of amplifier 27. Thus, the input current to amplifier 27 is $i = I_{n1} - I_{f1}$. Current $I_{f2}$ flows through capacitor $C_f$ 25 to the output and current $I_{n2}$ flows from the fourth terminal 34 to a junction 40 of capacitor $C_f$ 5 with the negative input to the amplifier 24.

When used in the present context of a control circuit for a digital magnetic tape transport, the output Eout of the ramp generator 10 is connected to drive a capstan servo loop 41 having a preamplifier 42 connected to a power amplifier 43 which in turn drives a capstan motor 44. A first feedback loop 45 provides feedback between the armature of the capstan motor 44 and the preamplifier 42. A tachometer 46 is mechanically linked to detect capstan velocity as represented schematically by dashed line 47 and is electrically connected to provide a second feedback signal to the preamplifier. The mechanical linkage 47 may be accomplished in a conventional manner by direct coupling to the shaft of the capstan motor 44 or by frictional engagement of a rotatable pulley with the tape in the vicinity of the capstan.

In contrast to conventional systems, the single output of the ramp generator 10 requires no diode coupling to the capstan servo loop 41 and the source impedance to preamplifier 42 remains essentially constant at a relatively small value over the entire operating range of the ramp generator. It is therefore possible to utilize only a small amount of compensation in the feedback circuit 45 to attain high speed, rapid response without oscillation at near zero ramp levels.

Digital commands indicating forward, stop and reverse are communicated to the input Ein of the ramp generator 10. The ramp generator 10 responds with an appropriate negative or positive ramp output signal at Eout which provides a precise reference for controlling acceleration or deceleration of the capstan motor 44. As shown in curve a of FIG. 2, typical commands of the digital Ein signal are represented by a forward command 50 at $t_1$, a stop command **50*a* at $t_2$ and a reverse command 50*b* at $t_3$. The stop command 50*a* is at ground potential while the forward and reverse commands have positive and negative voltages which preferably have approximately equal magnitudes which are in excess of the reverse breakdown voltage of Zener diode 18**. The magnitudes of the forward and reverse commands are typically ± 12 volts, respectively.

Figure 2:
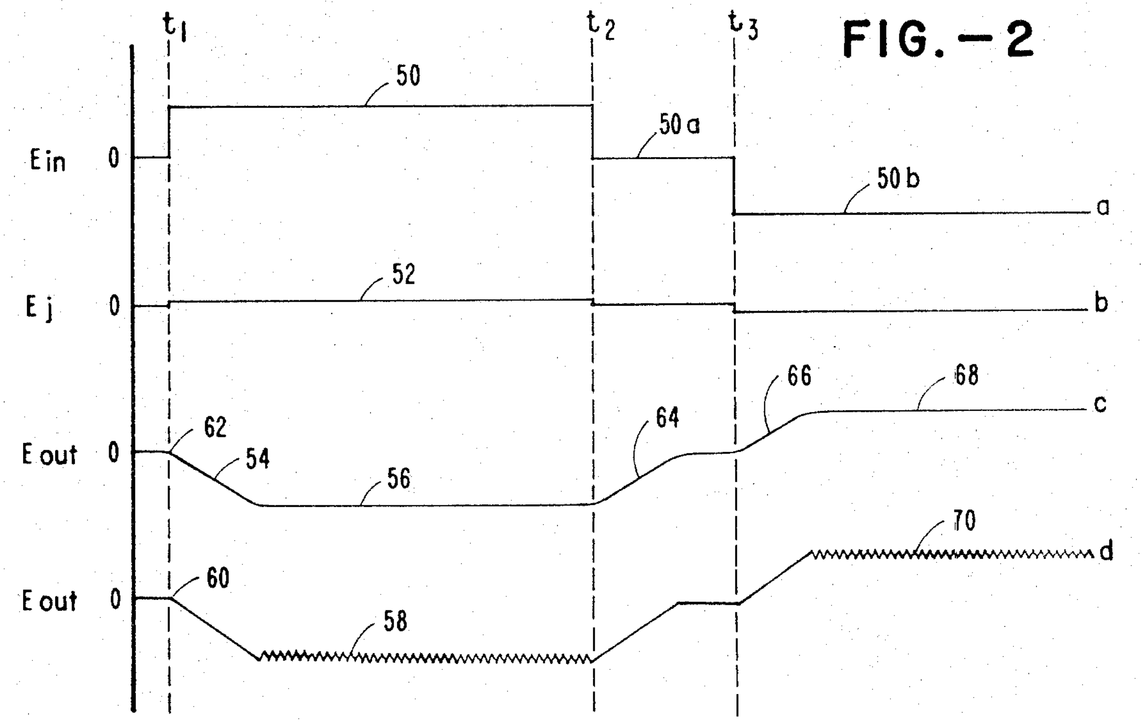
FIG. 2 is a representation of waveforms a-d which are useful in understanding the operation of the invention.

When a positive input voltage 50 is provided at Ein at time $t_1$ as shown in curve a of FIG. 2, the junction 12 rises to a slightly positive voltage 52 (curve *b*), causing a current $I_{n1} = (Vb/Rn+) - (Eout/R_f)$ to drive the positive input of operational amplifier 27. This input current will cause amplifier 27 to output sufficient current through diode D10 and resistor Rc+ that the voltage at the second terminal 33 rises to the maximum output voltage of amplifier 27 or to a voltage which will force sufficient current through resistor Rc+ to saturate the amplifier 27. As diode D10 conducts due to amplifier 27 diodes D8 and D9 are reverse biased and a current $I_{n2} = (+Vc - V_{D11})/Rc-$ drives the negative input 40 of output operational amplifier 24, where $V_{D11}$ is the forward voltage drop across diode D11. This current causes the output of amplifier 24 to go negative and draw current $I_{f2} = C_f$ (d Eout/dt ) $= I_{n2}$. A negative going ramp 54 is thus generated until Eout reaches its maximum negative voltage 56 at which time $I_{f1} = -Eout/R_f$ 26 will be equal to the reference current $I_{n1}$. When $I_{n1}$ and $I_{f1}$ are equal the input to amplifier 27 is zero, bridge limiter 28 becomes balanced and cuts off $I_{n2}$, and the output voltage Eout levels off at the maximum output voltage 56. This maximum output voltage 56 is controlled by adjusting resistor $R_f$ 26. As the resistance of resistor $R_f$ 26 increases, the magnitude of Eout must increase before $I_{f1} = I_{n1}$.

After amplifier 24 shuts off current $I_{f1}$ the load current will cause $C_f$ to slowly discharge, thereby creating a current $\Delta I_{f2}$ which drives the amplifier to output most of the current for the load and $I_{f1}$. However, as $C_f$ discharges the magnitude of Eout will decrease until $I_{f1}$ no longer equals $I_{n1}$ and amplifier 27 will be turned on. If damping resistor $R_d$, connected between ground and the negative input to amplifier 27, is relatively large so that the system is overdamped, a steady state condition will be reached as shown in curve *c* of FIG. 2 where a slight differential between $I_{f1}$ and $I_{n1}$ will turn amplifier 27 slightly on, thereby slightly imbalancing the bridge limiter 28 and causing a small current $\Delta I_{n2}$ to flow. Thus $\Delta I_{n2}$ causes the output of amplifier 24 to draw sufficient current to compensate for $\Delta I_{f1}$ and the load current and the system remains in balance. If, however, $R_d$ is sufficiently small that the system is unstable, amplifier 27 does not reach a steady state output but instead continuously switches between an on and an off condition. This switching causes amplifier 24 to be continously turned on and off causing a sawtooth waveform 58 to be superimposed on the maximum magnitude voltage level as shown in curve d of FIG. 2. Use of diodes 29 and 30 to limit the voltage swing of amplifer 27 decreases the magnitude of the ripple 58. While the underdamped condition results in a superimposed sawtooth waveform 58 which may be undesirable, it also results in a sharp transition 60 at time $t_1$ as the ramp begins. In contrast, when the ramp generator is overdamped, a gradual transition 62 to a ramp output somewhat delays the response.

Whenever Ein returns to zero as at time $t_2$, the output voltage Eout also returns to zero with a ramp function such as the ramp 64. A smooth, controlled deceleration function is thus provided when the ramp generator 10 is used in conjunction with a servo control. If Ein is zero, a nonzero Eout voltage causes a current $I_{f1}$ to flow. Current $I_{f1}$ drives amplifier 27, thereby unbalancing the bridge limiter 28 and inducing a current $I_{n2}$ to return Eout to zero in a ramp-like manner. Thus, a very precise zero output voltage Eout is maintained when the input voltage Ein is zero.

A negative voltage at Ein causes a positive going ramp 66 to be generated in a manner similar to the generation of the negative ramp 54, but with currents and voltages having opposite polarities. A negative Ein voltage causes diode D2, diode D3, Zener diode 18 and diode D6 to conduct and results in a negative current $I_{n1}$. Current $I_{n1}$ causes a negative output from amplifier 27 which causes diode D8 to conduct heavily, back biasing diodes D10 and D11. Diode D9 conducts a current $-I_{n2} = (-Vc - V_{D9})/Rc+$ which drives the inverting input of operational amplifier 24 to generate the positive ramp 66. $V_{D9}$ is the forward voltage drop across diode D9. The ramp 66 terminates with a maximum magnitude voltage 68 when the system is overdamped and a sawtooth waveform 70 when the system is underdamped.

In one arrangement, the ramp generator 10 was found to operate satisfactorily with the following components and values:

| | |
|---|---|
| Zener diode **18** | IN751A |
| D1–D6, D8–D9, diodes **29, 30** | IN914A |
| $R_z$ | 470 Ω |
| Rn+, Rn− | 5.1K 1% |
| $R_f$ | 7.5K potentiometer |
| Op amp **24**1/2 SN72558P | |
| Op amp **27** | 1/2 SN72558P |
| $R_d$ | 10K |
| $C_f$ | 0.047μf |
| Rc+, Rc− | 56K 1% |
| ±V | ±12.0 V.D.C. |
| Ein | ±12 volt step or 0 volts |

The ramp generator 10 provides dual polarity positive and negative ramps in response to negative and positive digital step inputs respectively. The ramps have slopes and maximum magnitudes which are nearly independent of input magnitude and the output ramps back to a precise zero point when the input returns to zero. Adjustments in the steady state amplitude may be made with a single potentiometer which affects the magnitude of positive and negative output signals equally.

Because only one potentiometer is used for both positive and negative ramps, time is saved both at the factory and in the field in calibrating and adjusting the circuit. Furthermore, because the reliability of electronic components is nearly infinite compared to that of a mechanical potentiometer, the reliability of the ramp generator is nearly double that of conventional ramp generators which require two potentiometers. In addition, the output voltage is precisely controlled for zero input voltage and any slight deviations affect positive and negative ramps equally.

The use of readily available components within the extremely simple circuit permits the ramp generator to be implemented with as few as three D.I.P. packages plus the integrating capacitor and potentiometer. As a result, both material and assembly costs are extremely small compared to conventional ramp generators having comparable precision.

The ramp functions can be made nonsymmetrical by changing certain component values. For instance, resistors Rc+ and Rc− control the magnitude of current $I_{n2}$ and therefore the slope of the positive and negative ramps respectively. Similarly, resistors Rn+ and Rn− control $I_{n1}$ which determines $I_{f1}$ and thereby control the relative maximum magnitudes of the positive and negative ramps.

The basic arrangement of a ramp generator 10 shown in FIG. 1 can be modified by the addition or substitution of variable resistances at selected points in the circuit to obtain special effects. These special effects can greatly increase the versatility of a ramp generator in accordance with the invention.

Figure 3:
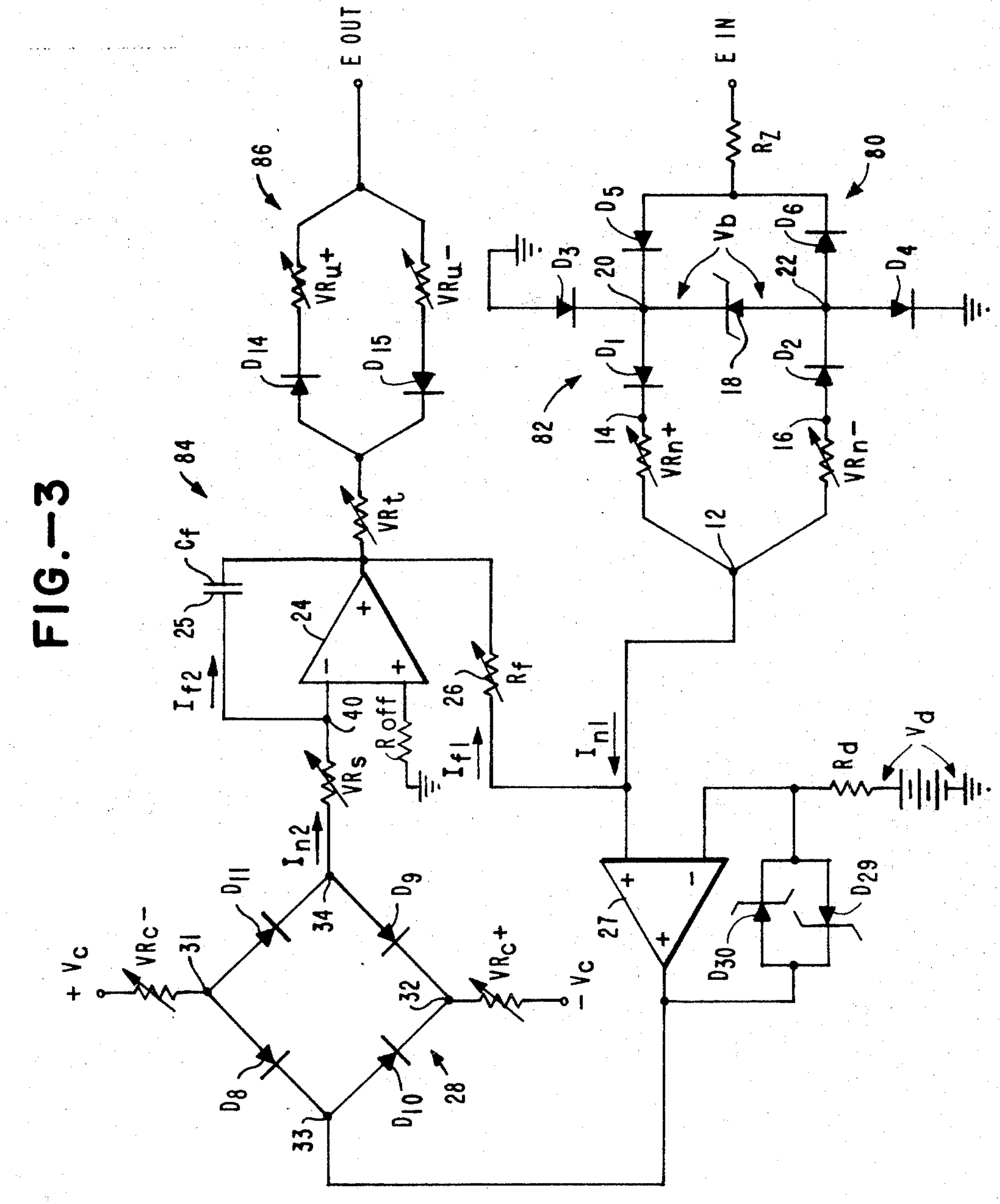
FIG. 3 is a schematic diagram of an alternative embodiment of a ramp generator in accordance with the invention.

As shown in FIG. 3, a ramp generator 80 includes an input bridge circuit 82 coupled to a summing junction 12, a constant current source responsive to current at the summing junction 12, an integrating amplifier circuit 84 responsive to the constant current source, a feedback impedance $R_f$ connected between an output of the integrating amplifier circuit 84 and the summing junction 12, and a variable slope output circuit 86 connected to the output of the integrating amplifier circuit 84. The input bridge circuit 82 is similar to the input bridge circuit of the ramp generator 10 and is similarly designated except that variable resistances VR*n*+ and VR*n*− are substituted for resistances R*n*+ and R*n*−, respectively. By varying the resistances VR*n*+ and VR*n*− the maximum output voltages for positive and negative ramps can be controlled independently. For instance, if VR*n*+ is decreased, a ramp output will have to go more negative before $I_{f1}$ equals $I_{n1}$ to bring the ramp generator circuit into equilibrium. Variable impedance $R_f$ can still be used to control the maximum outputs for both positive and negative ramps simultaneously.

Within the constant current source, which includes the amplifier 27 and the bridge limiter circuit 28, special characteristics may also be provided. A reference voltage $V_d$ connected between resistance $R_d$ at the negative input to amplifier 27 and ground may be used to shift the entire output voltage waveform. For instance, if the ramp generator 80 ramps between −12V and +12V with a quiescent point at OV when $V_d = 0$, it will ramp between −10V and +14V with a quiescent point at +2V when $V_d = 2$ volts. In addition, the substitution of variable impedances VR*c*+ and VR*c*− for fixed resistances R*c*+ and R*c*− permits the slopes of positive and negative output ramps to be independently varied without affecting the maximum magnitude of the output voltage.

The placing of a variable resistance $VR_s$ between the output 34 of the bridge limiter 28 and the junction 40 at the input to integrating amplifier 24 permits the slopes of both positive and negative ramps to be controlled symmetrically and simultaneously. However, care must be taken to insure that the maximum output voltage from amplifier 27 is allowed to exceed the voltage across resistance $VR_s$ plus the forward bias voltage of diode D8 or D10. Otherwise the bridge limiter circuit 28 will not properly act in a switching mode as a limiter.

When the ramp generator 80 is operating as a current generator, independent control of positive and negative ramps can be provided in a conventional manner by the output circuit 86. The output circuit 86 includes a variable resistance $VR_u$+ and a diode D14 connected to conduct positive output currents and variable resistance $VR_u$− and a diode D15 connected in parallel with $VR_u$+ and D14 to carry negative output currents. Changes in resistances $VR_u$+ and $VR_u$− affect both slope and maximum current in contrast to impedances $VR_n$+ and $VR_n$− which affect only maximum voltage and impedances $VR_c$+ and $VR_c$− which affect only slope.

Although there have been described above specific arrangements of ramp generators in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention.

What is claimed is:

1. A circuit for generating a ramp function at a circuit output in response to an input signal comprising:

a junction;

means for providing a selected current at the junction in response to the input signal;

a first amplifier having an output and an input, the output being connected to the circuit output;

a capacitor connected between the output and the input of the first amplifier;

current generating means connected to provide a current at the input of the amplifier in response to a current received from the junction, the current generating means including a second amplifier and a four terminal diode bridge limiter circuit, the second amplifier having an input of the same polarity as an output thereof connected to the junction and the output connected to one terminal of the bridge limiter circuit, the bridge limiter circuit having a terminal opposite the one terminal connected to the input of the first amplifier and two terminals adjacent the one terminal connected to positive and negative current sources respectively;

a DC voltage source and a resistance connected in series between an input of opposite polarity from the output of the second amplifier and ground; and an impedance connected between the output and the junction.

2. The invention as set forth in claim 1 above, further comprising means for limiting the maximum magnitude of a voltage at the output of the second amplifier.

3. A circuit for providing a ramp function at an output in response to an input comprising:

a first junction;

a Zener diode having a selected reverse breakdown voltage;

first and second impedances, each having first and second terminals, said first terminals being connected to the first junction;

means for providing the reverse breakdown voltage of said Zener diode across the second terminals of the first and second impedances in response to an input voltage, the second terminal of the first resistance being clamped when the input voltage is positive and the second terminal of the second resistance being clamped when the input voltage is negative;

means for providing a current in response to a current received from the first junction;

an output amplifier having an input and an output of opposite polarity connected to the output for the circuit, the input of the amplifier being connected to receive the current provided by the current providing means;

a capacitor connected between the input and output of the amplifier; and a third impedance connected between the output of the output amplifier and the junction.

4. The invention as set forth in claim 3 above, wherein the third impedance is a variable impedance controlling the maximum magnitude of the output signal.

5. The invention as set forth in claim 3 above, wherein the current providing means includes a second amplifier and a four terminal bridge limiter circuit operating as a constant current source in a switching mode, the second amplifier having its input connected to the junction and its output connnected to one terminal of the bridge limiter circuit, the bridge limiter circuit having a terminal opposite the one terminal connected to the input of the output amplifier and two adjacent terminals connected to positive and negative current sources respectively.

6. The invention as set forth in claim 5 above, further comprising a variable impedance connected between the terminal of the bridge limiter circuit opposite the one terminal and the input to first mentioned amplifier.

7. A ramp generator comprising:

a Zener diode providing a selected reverse breakdown voltage;

a junction;

first and second impedances, each having first and second terminals, said first terminals being connected to the junction;

means for providing substantially the reverse breakdown voltage of the Zener diode at the second terminals of the first and second impedances in response to positive and negative input voltages respectively, the second terminal of the first resistor being clamped when the input voltage is positive and the second terminal of the second resistor being clamped when the input voltage is negative;

an operational amplifier having an output connected to output of the ramp generator and an input of a polarity opposite that of the output;

a third variable impedance connected between the output of the operational amplifier and the first junction;

means connected between the input of the operational amplifier and the junction for providing an input current to the operational amplifier of a first polarity when the algebraic sum of currents through the first, second and third impedances has a first polarity and of a second polarity when the algebraic sum of currents through the first, second and third impedances has a second polarity; and a capacitor connected between the input and output of the operational amplifier.

8. A circuit for generating positive and negative ramp functions at a circuit output in response to a particularly characterized input signal comprising:

a junction;

an input bridge circuit providing precise temperature stable positive and negative reference currents at the junction in response to positive and negative input signals, the input bridge circuit including a Zener diode having an anode clamped with respect to ground in response to a positive input signal and a cathode clamped with respect to ground in response to a negative input signal, a first impedance connected between the junction and the cathode and a second impedance connected between the junction and the anode;

an integrating amplifier providing the circuit output and having an inverting input;

a feedback impedance coupled between the junction and the circuit output conducting a feedback current from the junction to the circuit output in response to a voltage differential therebetween; and a constant current source connected to drive the negative input to the integrating amplifier in response to a differential between the reference and feedback currents, the constant current source including a bridge limiter circuit operating in a switching mode to provide precisely controlled positive and negative currents at the negative input of the integrating amplifier and a precise quiescent circuit output voltage in response to a zero input voltage.

9. A circuit for generating dual polarity ramp functions having precise, independent control of positive and negative slopes and precise stop, forward and reverse steady state voltage levels at a circuit output in response to a digital input signal having positive, negative and zero voltage levels comprising:

a junction;

means for providing a precise, adjustable reference current at the junction in response to the input signal, the reference current being zero in response to a zero input voltage level, and the reference current having a polarity dependent upon the polarity of a non-zero input voltage level and a magnitude independent of the magnitude of a non-zero input voltage level;

an amplifier having an output and an input, the output being connected to the circuit output;

a capacitor connected to provide negative feedback between the output and the input of the amplifier;

current generating means including means operating in a switching mode, the current generating means being connected to provide a selected current at the input of the amplifier in response to a difference between a selectable reference voltage and a voltage at the junction, the polarity of the selected current being continuously dependent upon the polarity of the voltage difference; and an adjustable impedance connected between the output of the amplifier and the junction for controlling the magnitude of the forward and reverse steady state voltage levels.

* * * * *

PO-1050
(5/69)

UNITED STATES PATENT OFFICE
CERTIFICATE OF CORRECTION

Patent No. 3,745,373 Dated August 28, 1973

Inventor(s) Hale M. Jones and Richmon E. Deas

It is certified that error appears in the above-identified patent and that said Letters Patent are hereby corrected as shown below:

Column 5, line 10, for "$C_f$ 5" read --$C_f$25--; line 56, for "$I_{n1}$" read --$I_{n3}$--. Column 6, line 33, for "nously" read --nuously--; line 46, for "decleration" read --deceleration--. Column 7, line 12, for "Op amp 241/2 SN72558P" read --Op amp 24 1/2 SN72558P--. Column 9, lines 37 and 38, for "resistance" read --impedance--; lines 39 and 40, for "resistance" read --impedance--; line 62, for "connnected" read --connected--. Column 10, line 16, for "resistor" read --impedance--; line 18, for "resistor" read --impedance--; line 21, after "to" insert --provide the--; line 24, strike out "first".

Signed and sealed this 16th day of April 1974.

(SEAL)
Attest:

EDWARD M. FLETCHER, JR.
Attesting Officer

C. MARSHALL DANN
Commissioner of Patents